United States Patent
Tseng et al.

[11] Patent Number: 5,807,910
[45] Date of Patent: Sep. 15, 1998

[54] PREOLYMERIZING EPOXY RESIN, FUNCTIONALIZED RUBBER WITH FILLER TO FORM ADHESIVE

[75] Inventors: Tseng-Young Tseng, Taoyuan Hsien; Yeong-Tsyr Hwang; Hsiao-Chian Li, both of Hsinchu, all of Taiwan

[73] Assignees: Industrial Technology Research Institute, Hsinchu; Mek Tec Corporation, Kaohsiung, both of Taiwan

[21] Appl. No.: 880,364

[22] Filed: Jun. 23, 1997

[51] Int. Cl.⁶ .............. C08K 3/22; C08L 9/02; C08L 63/02

[52] U.S. Cl. .......... 523/428; 523/434; 523/457; 523/459; 523/467; 525/527; 525/529; 525/530; 525/531

[58] Field of Search ............ 525/113, 529, 525/530, 531, 527; 523/428, 429, 434, 457, 459, 467

[56] References Cited

U.S. PATENT DOCUMENTS 4,465,542  8/1984  Furihata ................. 523/467

FOREIGN PATENT DOCUMENTS

| | | |
|---|---|---|
| 92336 | 10/1983 | European Pat. Off. . |
| 59-196376 | 11/1984 | Japan . |
| 59-196377 | 11/1984 | Japan . |
| 60-141873 | 7/1985 | Japan . |
| 61-155483 | 7/1986 | Japan . |
| 62-64854 | 3/1987 | Japan . |
| 63-265985 | 11/1988 | Japan . |
| 3-28285 | 2/1991 | Japan . |
| 4-266922 | 9/1992 | Japan . |
| 6-1961 | 1/1994 | Japan . |
| 6-49427 | 2/1994 | Japan . |
| 6-181227 | 6/1994 | Japan . |
| 7-238269 | 9/1995 | Japan . |

*Primary Examiner*—Robert E. Sellers
*Attorney, Agent, or Firm*—Sughrue, Mion, Zinn, Macpeak & Seas, PLLC

[57] ABSTRACT

An adhesive for a flexible printed circuit board and the method of preparing the same where the adhesive displays excellent migration inhibition, moisture adsorption resistance, and superior peeling strength, heat resistance, solvent resistance, chemical resistance, flexibility, and electrical properties. The adhesive is prepared by prepolymerizing an epoxy resin, a COOH-containing rubber, a filler, and a primary catalyst in a solvent using a tertiary amine as a primary catalyst to form a prepolymer, followed by curing the prepolymer using a curing agent and a curing catalyst. The adhesive is coated on a plastic film, dried and laminated with a copper foil and then cured at an elevated temperature to form a substrate.

10 Claims, No Drawings

PREOLYMERIZING EPOXY RESIN, FUNCTIONALIZED RUBBER WITH FILLER TO FORM ADHESIVE

BACKGROUND OF INVENTION

1. Field of the Invention

The invention relates to an adhesive for a flexible printed circuit board, a method of preparing the same, and a substrate of the flexible printed circuit board using said adhesive. More particularly, it relates to an adhesive suitable for use in a substrate of a flexible printed circuit board, which demonstrates excellent copper wire-migration inhibition, moisture adsorption resistance, and also superior peeling strength, heat resistance, solvent resistance, chemical resistance, flexibility, and electrical properties.

2. Description of the Related Arts

Since 1979, acrylonitrile-butadiene rubber has been used in epoxy resin-based adhesives for the preparation of flexible printed circuit boards to enhance the flexibility of the adhesive after curing at an elevated temperature. However, when the adhesives contain acrylonitrile-butadiene rubber, if the width between two copper wires to be printed is less than 0.1 mm, the copper wires are prone to decompose and form dendritic crystals when an electric current is applied and are eroded by moisture. The phenomenon is called "migration" which frequently causes short circuits on the printed circuit boards and thus reduces the reliability of the products.

To solve this problem, Japanese Patent No. 2-269788 discloses an adhesive containing mercaptotriazines. The mercapto groups of the mercaptotriazines react with the surface of copper wires, capture the copper ions formed, and thus decrease the mobility of the copper ions so as to inhibit migration. Japanese Patent No. 3-294349 discloses an adhesive containing a reducing agent, phenol, to enhance the inhibition of migration.

As an alternative solution to this problem, other flexible polymers have been proposed to replace the acrylonitrile-butadiene rubber. For example, in Japanese Patent No. 5-9441, a soluble polyimide is synthesized, and added to the flexible printed circuit board adhesives to inhibit the migration. In Japanese Patent No. 5-39471, a polymer synthesized from a carbonate, a polyol, a diisocyanate and a diamine is added to the flexible printed circuit board adhesives to inhibit the migration.

Although the above proposals can partially or completely inhibit the migration, they necessitate the incorporation of additional chemicals into the adhesives or the substitutes for easily available acrylonitrile-butadiene rubber to endow the adhesives after curing with superior flexibility. These proposals thus complicate the manufacturing process or use substitutes with inferior flexibility.

SUMMARY OF THE INVENTION

An object of this invention is to solve the above-mentioned problems and provide an adhesive suitable for the preparation of a flexible printed circuit board substrate. This substrate has excellent migration inhibition and moisture adsorption resistance, and readily uses available acrylonitrile-butadiene rubber.

The above object is attained by using a tertiary amine as a primary catalyst to prepolymerize an expoxy resin with acrylonitrile-butadiene rubber in a suitable solvent followed by curing the prepolymer.

According to an aspect of the invention, not only acrylonitrile-butadiene rubbers can be used in the adhesive without the incorporation of additional chemicals, other rubbers containing —COOH, —C≡N or —OH functional groups can also be used in the adhesives to increase the flexibility of the adhesives after curing without causing migration.

DETAIL DESCRIPTION OF THE INVENTION

According to the invention, the adhesive is prepared by first prepolymerizing 100 parts by weight of an epoxy resin having at least two epoxy groups in each molecule; 30 to 100 parts by weight of a rubber having a —COOH, a —C≡N, or a —OH group; and 2 to 30 parts by weight of a filler in 100 to 400 parts by weight of a solvent using 0.01 to 1.0 parts by weight of a tertiary amine as a primary catalyst to form a prepolymer. The prepolymerization is performed at a temperature of 60° to 120° C. for 2 to 65 hours. The resulting prepolymers have a pH of 5.0 to 7.0. Optionally, an antioxidant in an amount of 0.01 to 10 parts by weight can be added to increase the antioxidation of the resulting adhesive. The prepolymer thus prepared is then mixed with 2 to 20 parts by weight of a curing agent and 0.1 to 10 parts by weight of a curing catalyst at a suitable temperature for a suitable period of time to form the adhesive of the invention.

In the preparation of the substrate of a flexible printed circuit board, the adhesive of the invention is first coated on the surface of a plastic film such as a film of PE, PET, polyphenylene sulfides, PVC and PP, dried in an oven at 60° to 160° C. and laminated with copper foils by a hot press at 60° to 200° C. The laminate is then cured at an elevated temperature of 100° to 200° C. to finish the process.

Epoxy resins suitable for use in this invention include but are not limited to novolac resins, bisphenol A epoxy resins, aromatic epoxy resins, alicyclic epoxy resins, halogenated epoxy resins and their mixtures. The epoxy resins used in the invention have at least two epoxy groups in each molecule. If flame retardance is required, the epoxy resins can contain 40% to 100% by weight of a halogenated epoxy resin. A preferred halogenated epoxy resin is a brominated epoxy resin having 10% to 50% by weight of bromine.

According to the invention, the kinds of rubbers that endow the adhesive with flexibility after curing are preferably acrylonitrile-butadiene rubber. This kind of rubber is readily available, for example Hycar 1300 series (Goodrich Co.,), 1041, 1042, 1072, and 1472 (Nippon Zeon Co.,). Note that the acrylonitrile-butadiene rubber should contain 1% to 10% by weight of carboxyl groups. Other kinds of rubber containing —COOH, —C≡N, or —OH functional groups can also be used according to the invention. Examples of these are SBR, NBR, acrylate elastomer, hydrogenated nitrile rubber, or carboxyl-terminated butadiene styrene (CTBS).

Inorganic fillers are used to increase dimensional stability, heat resistance, and mechanical punching strength of the resultant substrates. Fillers suitable for use in this invention include but are not limited to powders of $SiO_2$, $Al_2O_3$, $Al(OH)_3$, $Mg(OH)_2$, $Sb_2O_3$, $CaSiO_3$, $CaCO_3$, $MgCO_3$, MgO, ZnO, BN, mica, and quartz. A mixture of the above is also suitable for use. The powdered fillers preferably have an average particle size of less than 10 $\mu$m. To increase the compatibility with the organic ingredients of the adhesive, the inorganic fillers is preferably subject to surface treatment using silane, silazane, or silxone.

Antioxidants suitable for use in this invention can be 1010, 1222, 1076 (Ciba Geigy Co.,) or 399, 312, 210 (GE Specially Chemical). A mixture of the above antioxidants is also suitable for use.

Solvents suitable for use in this invention must dissolve the ingredients of the prepolymer completely. They include but are not limited to methyl ethyl ketone, acetone, methanol, ethanol, isopropanol, n-propanol and toluene. A mixture of the above solvents is also suitable for use.

The primary catalyst, tertiary amines, suitable for use in the invention include but are not limited to 1-methyl-2-pyrrolidinone, N-methylpyrrolidine, triethylamine, and triethanolamine. A mixture of the above in any proportion is also suitable for use.

The curing agents function as cross-linking agents and cross-link with the epoxy resins after the adhesive is coated on a plastic film and dried in an oven and cured at an elevated temperature. Curing agents suitable for use in this invention include but are not limited to cyanoguanidine, diethylene triamine, triethylene tetramine, diaminodiphenylmethane, diaminodiphenylsulfone, phthalic anhydride, tetrahydrophthalic anhydride, boron trifluoride amine complex compounds, multi-functional epoxy resins, and phenolic resins. A mixture of the above is also suitable for use.

Curing catalysts are added to increase the cross-linking rate of the epoxy resins with the curing agents when the adhesives are dried in an oven and subjected to curing at an elevated temperature. Curing catalysts suitable for use in this invention include but are not limited to 2-phenyl imidazole, 1-benzyl-2-methyl imidazole, 2-ethyl-4-methyl imidazole, boron trifluoride monoethylamine, zinc borofluoride, tin boronfluoride, and nickle borofluoride. A mixture of the above curing catalysts is also suitable for use.

The following specific examples are intended to demonstrate the invention more fully without acting as a limitation upon its scope, since numerous modifications and variations will be apparent to those skilled in this art. In the examples, all parts and % are by weight unless otherwise specified.

EXAMPLE 1

To a mixture of 11.5 parts of isopropanol and 203.95 parts of methyl ethyl ketone, 38 parts of epoxy resin (EPON 1001, Shell Chemical Co.,), 77.5 parts of brominated epoxy resin (LZ 8008, CIBA-GEIGY,) 20 parts of liquid acrylonitrile-butadiene rubber (Hycar 1300X13, Goodrich Co.,), 27 parts of solid acrylonitrile-butadiene rubber (CTBN 1072, Nippon Zeon Co.,), 2.1 parts of $Al_2O_3$ (particle size: 0.01 to 0.1 µm), 4.9 parts of $SiO_2$ (particle size: 0.01 to 0.1 µm), 0.1 parts of antioxidant (1010, CIBA-GEIGY,) and 0.02 parts of N-methylpyrrolidine were added. The resulting mixture was extensively stirred until a solution was formed and then allowed to react at 60° C. for 64 hours to form a prepolymer. The pH of the resultant prepolymer was 6. To the prepolymer solution, 1.54 parts of multi-functional epoxy resin, 5.33 parts of diaminodiphenylmethane, 0.15 parts of cyanoguanidine, 1.44 parts of $BF_3$ monoethylamine and a suitable amount of solvent were added. The resulting mixture was stirred and coated on the surface of a polyimide film by a coating machine. The coated film was then delivered to the oven at 120° C. and 140° C. respectively and dried for 1 to 3 minutes. The dried film and copper foils were then calendered at 80° C., and subsequently cured at 170° C. to form a laminate. The laminate substrate is suitable for use as a flexible printed circuit board substrate.

The substrate obtained was then cut into test samples for testing the peeling strength, heat resistance, solvent resistance, chemical resistance, flexibility, moisture adsorption resistance, and electrical properties. Peeling strength was measured according to the method of JIS C6481. Heat resistance was tested by immersing the test sample in a solder bath at 340° C. for 10 seconds to see if the test sample bubbled. Solvent resistance was determined by immersing the test sample in a solvent for 15 minutes and observing the distance the solvent penetrated into the adhesive between the polyimide and the copper foil. Chemical resistance was determined by immersing the test sample in an acid or base for 15 minutes and observing the distance the acid or base penetrated into the adhesive between the polyimide film and the copper foil. Flexibility was measured according to the method of JIS C5016.

The migration inhibition of the test samples was measured by the following procedures. Copper wires with a width of 0.1 mm were etched on the test samples. The samples were then covered with a film as a protecting layer, and placed in a thermostat which was set at 85° C. and a relative humidity of 85%. A DC 100 volt voltage was then applied to the copper wires for 1000 hours, and no dendritic crystals of copper were formed.

Moisture adsorption resistance was measured by the following procedures. The samples were first placed in a thermostat which was set at 85° C. and 85% RH for 100 hr, and then taken out and immersed in a solder bath at 340° C. for 10 seconds. No bubbling was observed.

EXAMPLE 2

To a mixture of 7.7 parts of isopropanol and 130.8 parts of methyl ethyl ketone, 38 parts of epoxy resin (EPON 1004, Shell Chemical Co.,), 77.5 parts of brominated epoxy resin (LZ 8008, CIBA-GEIGY,), 20 parts of liquid acrylonitrile-butadiene rubber (Hycar 1300X13, Goodrich Co.,), 27 parts of solid acrylonitrile-butadiene rubber (CTBN 1072, Nippon Zeon Co.,), 2.1 parts of $Al_2O_3$ (particle size: 0.01 to 0.1 µm), 4.9 parts of $SiO_2$ (particle size: 0.01 to 0.1 µm), 0.1 parts of antioxidant (1010, CIBA-GEIGY,), 0.02 parts of triethylamine were added. The resulting mixture was extensively stirred until a solution was formed and then allowed to react at 60° C. for 65 hours to form a prepolymer. The pH of the resultant prepolymer was 6. To the prepolymer solution, 1.23 parts of multi-functional epoxy resin, 4.27 parts of diaminodiphenylmethane, 0.12 parts of cyanoguanidine, 1.16 parts of $BF_3$ monoethylamine and a suitable amount of solvent were added. The resulting mixture was stirred and subjected to same procedures as set forth in Example 1 to form a flexible printed circuit board substrate. The substrate was then tested according to the same procedures as set forth in Example 1. No copper wire migration was observed after the substrate was tested for migration resistance over 1000 hr, and no bubbling was observed after the substrate was tested for moisture adsorption resistance by immersing in a solder bath at 340° C. for 10 seconds.

EXAMPLE 3

To a mixture of 9.4 parts of isopropanol and 163.3 parts of methyl ethyl ketone, 38 parts of epoxy resin (EPON 1004, Shell Chemical Co.,), 77.5 parts of brominated epoxy resin (LZ 8008, CIBA-GEIGY,), 20 parts of liquid acrylonitrile-butadiene rubber (Hycar 1300X13, Goodrich Co.,), 27 parts of solid acrylonitrile-butadiene rubber (CTBN 1072, Nippon Zeon Co.,), 2.1 parts of $Al_2O_3$ (particle size: 0.01 to 0.1 µm), 4.9 parts of $SiO_2$ (particle size: 0.01 to 0.1 µm), 0.1 parts of an antioxidant (1010, CIBA-GEIGY,), 0.02 parts of N-methylpyrrolidine were added. The resulting mixture was extensively stirred until a solution was formed and then allowed to react at 80° C. for 6 hr to form a prepolymer. The pH value of the resultant prepolymer was 5.5. To the prepolymer solution, 1.37 parts of multi-functional epoxy resin, 4.74 parts of diaminodiphenylmethane, 0.13 parts of cyanoguanidine, 1.28 parts of $BF_3$ monoethylamine and a suitable amount of solvent were added. The resulting mixture was stirred and subjected to the same procedures as set forth in Example 1 to form a flexible printed circuit board substrate. The resulting substrate was then tested according to same procedures as set forth in Example 1. No copper wire migration was observed after the substrate was tested for migration resistance over 1000 hr, and no bubbling was observed after the substrate was tested for moisture adsorption resistance by immersion in a solder bath at 340° C. for 10 seconds.

EXAMPLE 4

The same procedure as in Example 3 was repeated, except that the pre-polymerization was conducted at 80° C. for 16 hr. The pH of the reacted primary composition was 6.5. The resulting mixture was stirred and subjected to the same procedures as set forth in Example 1 to form a flexible printed circuit board substrate. The resulting substrate was then tested according to same procedures as set forth in Example 1. No copper wire migration was observed after the substrate was tested for migration inhibition over 1000 hours, and no bubbling was observed after the substrate was tested for moisture adsorption resistance by immersion in a solder bath at 340° C. for 10 seconds.

EXAMPLE 5

The same procedure as in Example 3 was repeated, except that the pre-polymerization was conducted at 80° C. for 65 hr. The pH of the reacted primary composition was 6.5. The resulting mixture was stirred and subjected to the same procedures as set forth in Example 1 to form a flexible printed circuit board substrate. The resulting substrate was then tested according to same procedures as set forth in Example 1. No copper wire migration was observed after the substrate was tested for migration inhibition over 1000 hours, and no bubbling was observed after the substrate was tested for moisture adsorption resistance by immersing in a solder bath at 340° C. for 10 seconds. Besides migration inhibition, all test results included peeling strength, heat resistance, solvent resistance, chemical resistance, flexibility, moisture adsorption resistance and electrical properties. The results are listed in Table 1.

TABLE 1

| Tested property | Results |
| --- | --- |
| Peeling strength (JIS C6481) | >1.10 kgf |
| Heat resistance | |
| (340° C. solder bath, 10 sec.) | 0/5 |
| Solvent resistance (15 min.) | |
| methyl ethyl ketone | <0.3 mm |
| isopropanol | <0.3 mm |
| acetone | <0.3 mm |
| Chemical resistance (15 min.) | |
| HCl (5%) | |
| NaOH (5%) | >0.3 mm |
| >0.3 mm | |
| Flexibility (JIS C5016) | O.K. |
| Moisture adsorption resistance | |
| (85° C., RH 85%, 500 hr) | >0.86 kgf |
| Peeling strength (JIS C6481) | |
| Heat resistance (solder bath, 10 sec.) | >310° C. |

TABLE 1-continued

| Tested property | Results |
| --- | --- |
| Electrical properties insulation resistance | |
| between wires (Ω) 0.01 mm | $1.03 \times 10^{13}$ |
| surface resistance (Ω· cm) | $2.19 \times 10^{14}$ |
| volume resistance (Ω· cm) | $7.32 \times 10^{15}$ |

COMPARATIVE EXAMPLE

To a mixture of 7.55 parts of isopropanol and 127.95 parts of methyl ethyl ketone, 38 parts of epoxy resin (EPON 1004, Shell Chemical Co.,), 77.5 parts of brominated epoxy resin consisting of 62 parts of solids and 15.5 parts of solvent (LZ 8008, CIBA-GEIGY,), 20 parts of liquid acrylonitrile-butadiene rubber (Hycar 1300X13, Goodrich Co.,), 27 parts of solid acrylonitrile-butadiene rubber (CTBN 1072, Nippon Zeon Co.,), 1.2 parts of $Al_2O_3$ (particle size: 0.01 to 0.1 μm), 2.8 parts of $SiO_2$ (particle size: 0.01 to 0.1 μm) were added. The resulting mixture was extensively stirred until a solution was formed. The pH of the resultant solution was 4.5. To the solution, 1.21 parts of multi-functional epoxy resin, 4.18 parts of diaminodiphenylmethane, 0.12 parts of cyanoguanidine, 1.13 parts of $BF_3$ monoethylamine and a suitable amount of solvent were added. The resulting mixture was stirred and subjected to the same procedures as set forth in Example 1 to form a flexible printed circuit board substrate. The resulting substrate was then tested according to same procedures as set forth in Example 1. Copper wire migration was observed after the substrate was tested for migration resistance for 100 hours, and bubbling was observed when the substrate was tested for moisture adsorption resistance by immersion in a solder bath at 340° C. for 10 seconds, no bubbling was observed until in a solder bath at 310° C. for 10 seconds.

What is claimed is:

1. A method of preparing an adhesive for a flexible printed circuit board, comprising the following steps:
   (a) dissolving 100 parts by weight of an epoxy resin having at least two epoxy groups in each molecule, 30 to 100 parts by weight of a rubber having a functional group selected from the group consisting of —COOH, —C≡N, and —OH group, 0.01 to 1.0 parts by weight of a tertiary amine serving as a primary catalyst, and 2 to 30 parts by weight of a filler in 100 to 400 parts by weight of a solvent to obtain a premixture and pre-polymerizing the mixture at a temperature of 60° to 120° C. to obtain a pre-polymer;
   (b) mixing the prepolymer with 2 to 20 parts by weight of a curing agent and 0.1 to 10 parts by weight of a curing catalyst.

2. The method as claimed in claim 1, wherein the epoxy resin includes 40 to 100% by weight of a halogenated epoxy resin.

3. The method as claimed in claim 2, wherein the halogenated epoxy resin is a brominated epoxy resin which includes 10 to 50% by weight of bromine.

4. The method as claimed in claim 1, wherein the rubber having a —COOH group is an acrylonitrile-butadiene rubber.

5. The method as claimed in claim 1, wherein the tertiary amine is selected from the group consisting of 1-methyl-2-pyrrolidinone, N-methyl-pyrrolidine, triethylamine, triethanolamine and a mixture thereof.

6. The method as claimed in claim 1, wherein the solvent is selected from the group consisting of methyl ethyl ketone, acetone, methanol, ethanol, isopropanol, n-propanol, toluene, xylene and a mixture thereof.

7. The method as claimed in claim 1, wherein the curing agent is selected from the group consisting of cyanoguanidine, diethylene triamine, triethylene tetramine, diaminodiphenylmethane, diaminodi-phenylsulfone, phthalic anhydride, tetrahydrophthalic anhydride, boron trifluoride amine complex compound, multi-functional epoxy resin, phenolic resin and a mixture thereof.

8. The method as claimed in claim 1, wherein the curing catalyst is selected from the group consisting of 2-phenyl imidazole, 1-benzyl-2-methyl imidazole, 2-ethyl-4-methyl imidazole, boron trifluoride monoethylamine, zinc borofluoride, tin boronfluoride, nickle borofluoride and a mixture thereof.

9. The method as claimed in claim 1, wherein step (a) further comprises dissolving 0.01 to 1.0 parts by weight of an antioxidant in the solvent.

10. The method as claimed in claim 1, wherein in step (a) the prepolymerizing is performed for 2 to 65 hours.

* * * * *